(12) United States Patent
Singer et al.

(10) Patent No.: US 9,190,394 B2
(45) Date of Patent: Nov. 17, 2015

(54) LED MODULE

(71) Applicant: OSRAM Opto Semiconductors GmbH, Regensburg (DE)

(72) Inventors: Frank Singer, Regenstauf (DE); Michael Zitzlsperger, Regensburg (DE); Stefan Groetsch, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/346,687

(22) PCT Filed: Sep. 21, 2012

(86) PCT No.: PCT/EP2012/068606
§ 371 (c)(1),
(2) Date: Mar. 21, 2014

(87) PCT Pub. No.: WO2013/045353
PCT Pub. Date: Apr. 4, 2013

(65) Prior Publication Data
US 2014/0231837 A1 Aug. 21, 2014

(30) Foreign Application Priority Data
Sep. 29, 2011 (DE) .......................... 10 2011 115 314

(51) Int. Cl.
*H01L 29/18* (2006.01)
*H01L 29/22* (2006.01)
(Continued)

(52) U.S. Cl.
CPC ........... *H01L 25/0753* (2013.01); *F21S 48/115* (2013.01); *H01L 33/62* (2013.01);
(Continued)

(58) Field of Classification Search
CPC ...... H01L 33/64; H01L 33/62; H01L 25/0753
USPC .................................. 257/81, 88, 98, 99, 100
See application file for complete search history.

(56) References Cited

U.S. PATENT DOCUMENTS 6,670,751 B2 * 12/2003 Song et al. ..................... 313/512
7,170,151 B2 * 1/2007 Elpedes et al. ................. 257/676
(Continued)

FOREIGN PATENT DOCUMENTS

| DE | 102005018175 A1 | 10/2006 |
|---|---|---|
| EP | 1986235 A2 | 10/2008 |
| EP | 2124255 A1 | 11/2009 |
| JP | 2010170945 A | 8/2010 |
| TW | I335677 B | 1/2011 |

OTHER PUBLICATIONS

Illek, S., et al., "Scalability of buried micro-reflector light emitting diodes for high-current applications," Proc. SPIE 4996, Light-Emitting Diodes: Research, Manufacturing, and Applications VII, Jul. 9, 2003, pp. 18-25.

*Primary Examiner* — Hung Vu
(74) *Attorney, Agent, or Firm* — Slater & Matsil, L.L.P.

(57) ABSTRACT

An LED module has an electrically insulating main body, a base surface and a mounting surface located opposite the base surface. A number of electrical connection contacts are arranged at the mounting surface. The connection contacts do not adjoin the base surface. A heat sink is arranged in the main body. The heat sink extends from the mounting surface as far as the base surface. Furthermore, the LED module has a number of LED chips, each having an electrically insulating carrier substrate at a chip underside and two chip contacts at a chip top side. The LED chips are arranged with the electrically insulating carrier substrate on the heat sink.

19 Claims, 3 Drawing Sheets

(51) Int. Cl.
*H01L 25/075* (2006.01)
*H01L 33/62* (2010.01)
*F21S 8/10* (2006.01)
*H01L 33/64* (2010.01)

(52) U.S. Cl.
CPC .............. *H01L 33/64* (2013.01); *H01L 33/642* (2013.01); *H01L 2224/32245* (2013.01); *H01L 2224/48247* (2013.01); *H01L 2224/48471* (2013.01); *H01L 2224/48479* (2013.01); *H01L 2224/73265* (2013.01); *H01L 2924/19107* (2013.01)

(56) References Cited

U.S. PATENT DOCUMENTS

| | | | |
|---|---|---|---|
| 7,795,051 | B2 | 9/2010 | Elpedes et al. |
| 8,203,165 | B2 * | 6/2012 | Lee et al. ................ 257/99 |
| 2002/0175621 | A1 | 11/2002 | Song et al. |
| 2006/0197101 | A1 | 9/2006 | Wu |
| 2008/0008427 | A1 | 1/2008 | Takeda et al. |
| 2008/0128718 | A1 | 6/2008 | Sumitani |
| 2008/0151557 | A1 | 6/2008 | Su et al. |

* cited by examiner

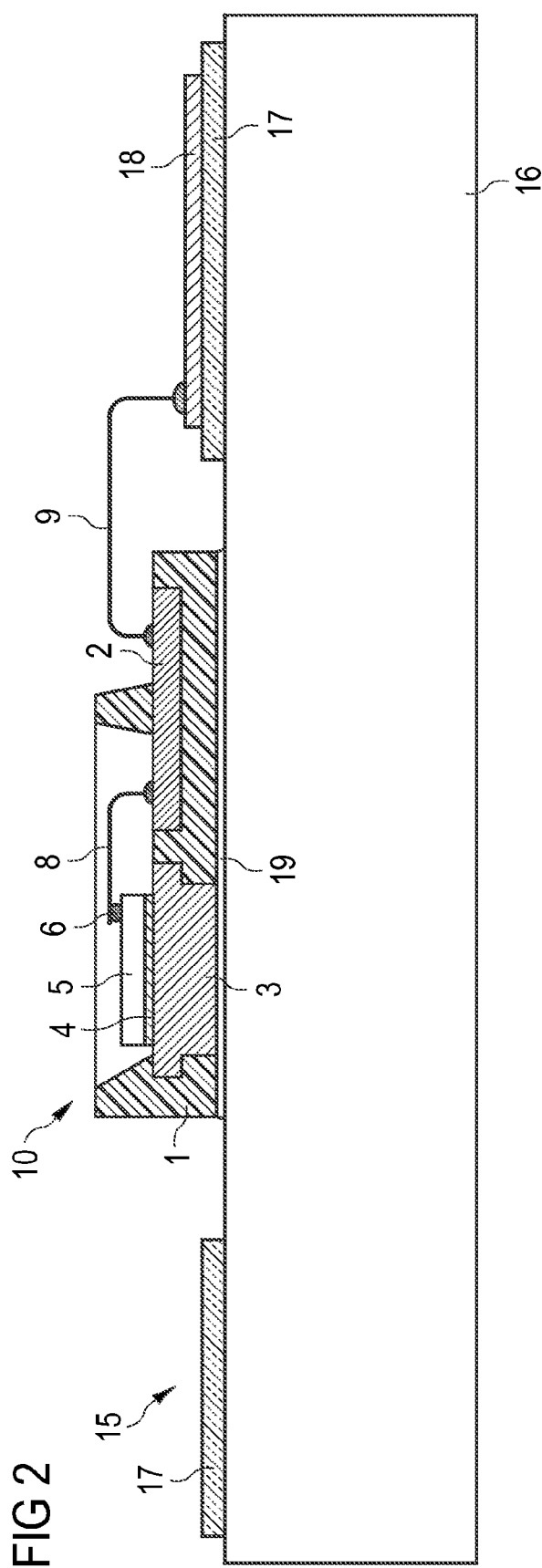

LED MODULE

This patent application is a national phase filing under section 371 of PCT/EP2012/068606, filed Sep. 21, 2012, which claims the priority of German patent application 10 2011 115 314.8, filed Sep. 29, 2011, each of which is incorporated herein by reference in its entirety.

TECHNICAL FIELD

The invention relates to an LED module, in particular an LED module for a motor vehicle headlight.

BACKGROUND

An LED module for a motor vehicle headlight is known from the document U.S. Patent Application Publication No. 2008/0008427 A1, for example.

SUMMARY OF THE INVENTION

Embodiments of the invention provide an improved LED module, in particular for use in a motor vehicle headlight, that is distinguished in particular by good heat dissipation from the LEDs and a comparatively low production outlay.

In accordance with at least one embodiment, the LED module has an electrically insulating main body. Furthermore, the LED module has a base surface and a mounting surface situated opposite the base surface. In accordance with one configuration, at least a partial region of the main body adjoins the base surface of the LED module, and at least a further partial region of the main body adjoins a mounting surface of the LED module situated opposite the base surface. The electrically insulating main body preferably comprises a plastic. The base surface of the LED module is preferably embodied in a planar fashion, such that the LED module can be mounted onto a carrier such as a printed circuit board, for example, at the base surface.

In accordance with one configuration, a plurality of electrical connection contacts are arranged at the mounting surface. The connection contacts are formed from a metal or a metal alloy, for example. The connection contacts preferably do not adjoin the base surface of the LED module and are advantageously electrically insulated from the base surface by the material of the electrically insulating main body. In other words, the electrical connection contacts are not electrical plated-through holes extending from the mounting surface to the base surface of the main body. Rather, provision is made for making contact with the electrical connection contacts at the mounting surface.

In one advantageous configuration, a heat sink is arranged in the main body. The heat sink is preferably formed from a metal or a metal alloy. The heat sink can contain or consist of copper, for example. The heat sink advantageously extends from the mounting surface as far as the base surface of the LED module. In this way, the heat sink advantageously forms a thermally conductive connection between the mounting surface and the base surface.

The heat sink preferably has a planar base surface adjoining the planar base surface of the main body in a flush fashion. The planar base surface of the main body and the planar base surface of the heat sink embedded into the main body advantageously jointly form a planar base surface of the LED module with which the LED module can be mounted onto a carrier.

A top side of the heat sink is adjacent to a partial region of the main body preferably in a flush fashion at the mounting surface. The electrical connection contacts are preferably embedded into the main body in such a way that their top side lies in the same plane as an adjoining part of the surface of the main body and the top side of the heat sink. The top sides of the heat sink, of the connection contacts and also a partial region of the surface of the main body advantageously form the mounting surface of the LED module.

In accordance with at least one configuration, the LED module has a plurality of LED chips having in each case an electrically insulating carrier substrate at a chip underside and in each case two chip contacts at a chip top side. The electrically insulating carrier substrate of the LED chips advantageously has a high thermal conductivity. In particular, the LED chips can have in each case a carrier substrate composed of a ceramic.

In accordance with at least one configuration, the LED chips are arranged with the electrically insulating carrier substrate on the heat sink. Each of the plurality of LED chips can emit the heat generated during operation via its carrier substrate to the common heat sink. Particularly good dissipation of heat from the plurality of LED chips of the LED module is obtained in this way.

The LED module can advantageously be thermally connected in the region of the heat sink at the base surface of the LED module, while the electrical connection contacts are arranged at the mounting surface situated opposite the base surface. The base surface is therefore advantageously potential-free, thereby facilitating the mounting of the LED module onto an arbitrary surface, for example in a motor vehicle headlight. In particular, the LED module can be mounted directly onto a cooling body.

The base surface of the LED module is advantageously formed by the base surface of the heat sink, which preferably comprises a metal or a metal alloy, and the base surface of the electrically insulating main body, which preferably comprises a plastic. The base surface of the LED module preferably comprises no ceramic. The LED module can therefore advantageously be soldered or adhesively bonded onto a carrier composed of a metal or a metal alloy, without the occurrence of high mechanical stresses that can occur, for example, in the case of an LED module comprising a submount composed of a ceramic on a carrier composed of a metal or a metal alloy on account of the different coefficients of thermal expansion of the ceramic and the metal.

The LED module advantageously has only a small number of individual parts and is therefore distinguished by a comparatively low production outlay.

In one preferred configuration, the LED chips have in each case a carrier substrate which contains or consists of AlN or SiN. These materials have a high thermal conductivity and are electrically insulating.

In one preferred configuration, the LED chips have no growth substrate. In particular, the LED chips can have in each case a semiconductor layer sequence comprising an active layer contained therein, wherein a growth substrate used for the epitaxial growth of the semiconductor layer sequence was subsequently detached from the LED chip. This can be done, for example, in such a way that the semiconductor layer sequence of the LED chip is firstly grown epitaxially onto the growth substrate, the LED chip is subsequently connected to the carrier substrate at the side situated opposite the growth substrate, and the growth substrate is subsequently detached from the LED chip, for example, by a laser lift-off method. This makes it possible, in particular, to use a carrier substrate which does not have to be suitable for the epitaxial growth of the semiconductor layer sequence of the LED chip and can therefore be selected according to other criteria, in particular the thermal conductivity.

The base surface of the LED module is preferably free of electrical connection contacts. In particular, the electrical connection contacts are advantageously embedded into the main body at the mounting surface in such a way that they are electrically insulated from the base surface of the LED module by the material of the main body.

In one configuration, the LED module is mounted onto a printed circuit board at the base surface. Particularly preferably, the LED module is mounted onto a metal-core circuit board at the base surface. This makes it possible for the heat generated by the LED chips to be dissipated to the metal core of the metal-core circuit board via the heat sink.

In one preferred configuration, the heat sink is connected to the metal core of the metal-core circuit board. In particular, the heat sink can be directly soldered or adhesively bonded onto the metal core of the metal-core circuit board. An electrically insulating layer and an electrically conductive layer which are generally arranged for producing conductor tracks on a metal-core circuit board are removed from the metal core in the region of the connection between the heat sink and the metal-core circuit board. Particularly good dissipation of heat from the LED chips is obtained in this way. The thermal resistance between the LED chips and the metal core of the metal-core circuit board is preferably 1 K/W or less.

The heat sink and the metal core of the metal-core circuit board are preferably formed from the same metal or the same metal alloy. By way of example, the heat sink and the metal core can in each case contain or consist of copper. In this case, the heat sink and the metal core advantageously have the same coefficient of thermal expansion. This has the advantage that mechanical stresses in the event of temperature changes that occur in particular where there is a change between the operating temperature of the LED module and the ambient temperature are reduced.

In one preferred configuration, the heat sink is connected to the metal core of the metal-core circuit board by means of a conductive adhesive containing silver. The conductive adhesive can be, in particular, an epoxy conductive adhesive containing silver. A connection having a particularly good thermal conductivity is obtained in this way.

In a further preferred configuration, an upper part of the electrically insulating main body, said upper part being arranged above the mounting surface, forms a cavity in which the LED chips are arranged. The cavity formed by the upper part of the electrically insulating main body preferably has side walls that serve for the beam shaping of the radiation emitted by the LED chips. By way of example, the cavity can have side walls shaped as a reflector or diaphragms. By virtue of the fact that the side walls of the cavity reflect and/or shade part of the radiation emitted by the LED chips, it is possible to generate high contrasts. This can be utilized, for example, for generating a low-beam light function in a motor vehicle headlight.

In a further preferred configuration, part of the upper part of the electrically insulating main body is arranged on the connection contacts in such a way that a first region of the connection contacts facing the LED chips is arranged in the cavity, and a second region of the connection contacts is arranged outside the cavity. By way of example, the chip contacts of the LED chips can be electrically conductively connected in each case to the first region of a connection contact. In particular, a bonding wire can in each case be led from a chip contact of an LED chip to the first region of a connection contact. The LED chips and the bonding wires led from their chip contacts to the connection contacts are therefore arranged in the cavity.

The cavity can advantageously be filled with a potting material, which in particular protects the LED chips and the bonding wires thereof against mechanical damage. Furthermore, a potting material arranged in the cavity can contain a phosphor in order to convert at least part of the radiation emitted by the LED chips toward a longer wavelength. In this case, the potting compound functions as a luminescence conversion layer. By means of the luminescence conversion layer, white light is generated, for example, by color mixing of an ultraviolet or blue radiation emitted by the LED chips and the converted radiation.

The second regions of the connection contacts, arranged outside the cavity, are advantageously freely accessible externally, such that contact can be made with the LED module externally in the second regions of the connection contacts. By way of example, the second regions of the connection contacts can be connected to a power supply by means of a wire contact, a strip contact or a plug contact.

The chip contacts at the top side of the LED chips are electrically conductively connected in each case to one of the electrical connection contacts or to the chip contact of a further LED chip. By way of example, the chip contacts of the LED chips can be electrically conductively connected to one of the connection contacts or a chip contact of an adjacent LED chip in each case by means of a bonding wire.

In one preferred configuration, the LED chips are arranged in a series circuit. The series circuit can be realized, for example, in such a way that a first connection contact of the LED module is connected to a first chip contact at a semiconductor region of a first conduction type of the first LED chip. The chip contact at a second semiconductor region of a second conduction type of the first LED chip is connected to the chip contact at a first semiconductor region of a first conduction type of the second LED chip. The further chip contacts of the LED chips are connected to one another in such a way that in each case the chip contact of the semiconductor region having the second conduction type is connected to the chip contact of the semiconductor region having the first conduction type of the succeeding LED chip. The chip contact at a second semiconductor region of the second conduction type of the last LED chip of the series circuit connected to a further connection contact of the LED module.

In a further advantageous configuration, the two chip contacts of each LED chip are connected to two adjacent connection contacts in each case in such a way that the LED chips are arranged in a series circuit. In this configuration, each LED chip is connected to two adjacent connection contacts, wherein two adjacent LED chips are assigned a common connection contact. By way of example, a first connection contact is connected to the first chip contact of a first LED chip, the second chip contact of the first LED chip is connected to the second connection contact, the second connection contact is connected to the first chip contact of the second LED chip, the second chip contact of the second LED chip is connected to the third connection contact, and so on. In this configuration, therefore, the electrical connection between two adjacent LED chips is not effected by a direct electrical connection between the second chip contact of a chip and the first chip contact of the succeeding LED chip, but rather via a common electrical connection contact. In this configuration, the LED module advantageously has a number of N+1 connection contacts if the number of LED chips is N. This configuration has the advantage that, by means of an appropriate selection of the connection contacts, contact can be made with either all or only a portion of the LED chips. In a motor vehicle headlight, this can be utilized, for example, for realizing different lighting functions, such as low beam and high beam, for example. The two connection contacts that are advantageously assigned to each of the LED chips in this configuration can also be used for testing the LED chips of the LED module.

In a further advantageous configuration, the electrically insulating main body of the LED module has at least one alignment structure. The alignment structures can be, in particular, cutouts for alignment or fixing means. By way of example, a mount for the LED module can latch into the cutouts of the alignment structures. The cutouts are preferably arranged in the vicinity of a side edge of the main body. By means of the alignment structures, the LED module can be incorporated into a motor vehicle headlight in a predefined position in a simple manner.

In one preferred configuration, the LED module is part of a motor vehicle headlight. In particular, the LED module can be part of a front headlight for a motor vehicle.

BRIEF DESCRIPTION OF THE DRAWINGS

The invention is explained in greater detail below on the basis of exemplary embodiments in association with FIGS. 1 to 3.

FIG. 2 shows a schematic illustration of a cross section through an LED module in accordance with a second exemplary embodiment;

Identical or identically acting constituent parts are provided in each case with the same reference signs in the figures. The illustrated constituent parts and the size relationships of the constituent parts among one another should not be regarded as true to scale.

DETAILED DESCRIPTION OF ILLUSTRATIVE EMBODIMENTS

Figure 1A:
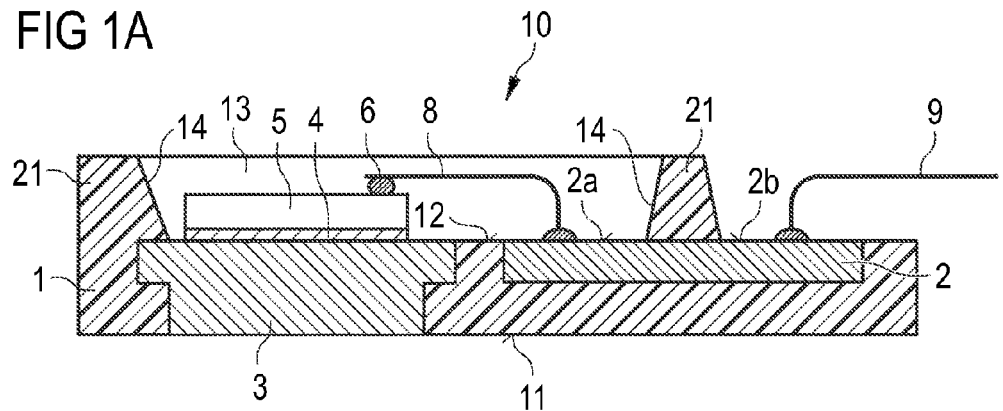
FIG. 1A shows a schematic illustration of a cross section through an LED module in accordance with a first exemplary embodiment.
Figure 1B:
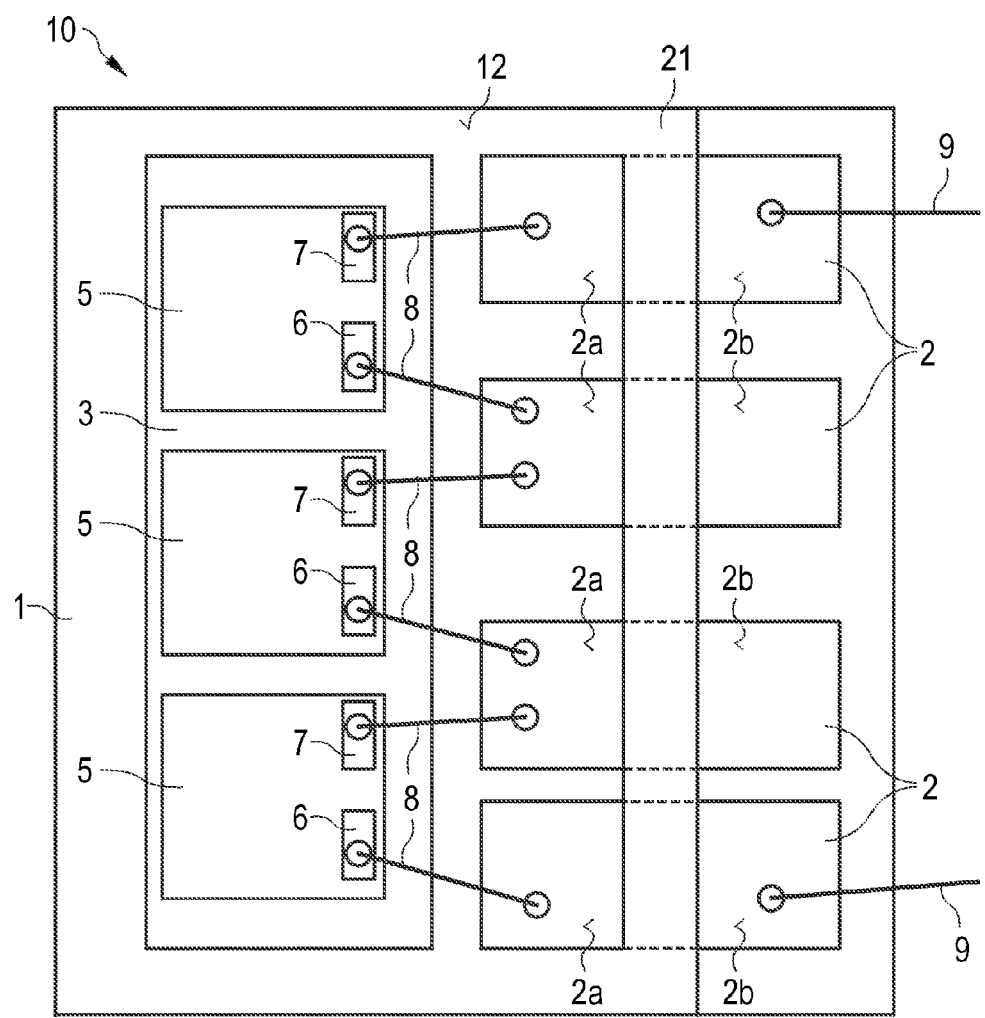
FIG. 1B shows a schematic illustration of a plan view of the LED module in accordance with the first exemplary embodiment.

The LED module 10 illustrated in cross section in FIG. 1A and in a plan view in FIG. 1B has an electrically insulting main body 1, which is preferably formed from plastic. The main body 1 can be produced by compression molding, in particular. The LED module 10 has a base surface 11 and a mounting surface 12 situated opposite the base surface 11. The mounting surface 12 is provided for mounting the plurality of LED chips 5 of the LED module 10 and for producing the electrical connections. The base surface 11 is provided for mounting the LED module 10 onto a carrier such as a printed circuit board, for example. The main body 1 adjoins the base surface 11 in partial regions and the mounting surface 12 in partial regions.

A plurality of electrical connection contacts 2 composed of a metal or a metal alloy are arranged at the mounting surface 12. The electrical connection contacts 2 are preferably embedded into the electrically insulating main body 1 in such a way that they run in a flush fashion with respect to those regions of the main body 1 which are arranged at the mounting surface 12, and in particular do not adjoin the base surface 11 of the LED module 10.

The LED module 10 furthermore has a heat sink 3, which is embedded into the main body 1 in such a way that it extends from the mounting surface 12 as far as the base surface 11 of the LED module 10. The heat sink 3 comprises a metal or a metal alloy. Advantageously, the heat sink 3 is formed from a metal or a metal alloy having a high thermal conductivity, in particular from copper or aluminum or a metal alloy comprising copper or aluminum. The heat sink 3 advantageously forms a thermally conductive connection between the mounting surface 12 and the base surface 11 of the LED module 10.

The LED module 10 has a plurality of LED chips 5. In order to simplify the illustration, only three LED chips are illustrated in FIG. 1. However, the LED module 10 can also have more LED chips 5. The LED chips 5 are arranged in a series, for example, at distances of approximately 100 µm, in the exemplary embodiment. Alternatively, the LED chips 5 could also be arranged in an array. The LED chips 5 can have, for example, a size of in each case approximately 1 mm×1 mm.

The LED chips 5 have in each case an electrically insulting carrier substrate 4. The electrically insulating carrier substrates 4 of the LED chips 5 are preferably formed from a material having a high thermal conductivity. In particular, the carrier substrates 4 of the LED chips 5 can comprise a ceramic, such as, SiN or AlN, for example.

The LED chips 5 advantageously in each case have no growth substrate. That is to say that a growth substrate used for the epitaxial growth of the semiconductor layer sequences of the LED chips 5 was detached from the semiconductor layer sequences of the LED chips 5. This can be done, for example, in such a way that the semiconductor layer sequences of the LED chips 5 are firstly grown onto the growth substrate, wherein the electrically insulating carrier substrates 4 are applied to that surface of the LED chips 5 which is situated opposite the growth substrate. The growth substrate can subsequently be detached from the LED chips 5, for example, by a laser lift-off process, such that the LED chips 5 can subsequently be mounted at the carrier substrate 4 onto a carrier such as the heat sink 3, for example. By virtue of the fact that the LED chips 5 have no growth substrate, the heat generated in the semiconductor layer sequence of the LED chips 5 can be carried away to the heat sink 3 particularly well via the thermally conductive carrier substrates 4.

The LED chips 5 have in each case two chip contacts 6, 7 at the chip top side. By way of example, the first chip contact 6 can be connected in each case to a p-doped semiconductor region of the LED chip 5, and the second chip contact 7 to an n-doped semiconductor region of the LED chip 5, or vice versa. The chip contacts 6, 7 are connected in each case to one of the connection contacts 2. The LED chips 5 are preferably arranged in a series circuit.

Electrical contact is made with the LED chips 5 in the series circuit preferably in such a way that two adjacent LED chips 5 are assigned a common connection contact 2, to which two chip contacts 6, 7 of opposite polarity of the two adjacent LED chips 5 are connected. Therefore, the connection of the two chip contacts 6, 7 of two adjacent LED chips 5 is not effected directly, for example, by a bonding wire led from an LED chip 5 to the adjacent LED chip 5, but rather by a bonding wire 8 led from the chip contact 7 having a first polarity to the common connection contact 2 and by a further bonding wire 8 led from the common connection contact 2 to the chip contact 6 having the first polarity of the adjacent LED chip 5.

The connection of adjacent LED chips 5 via in each case a common connection contact 2 has the advantage over a direct connection of an LED chip 5 to the adjacent LED chip that contact can be made with an arbitrary number of LED chips 5 in a series circuit by means of a selection of the connection contacts 2 for the external contact-making. This can be utilized in particular for realizing different functions of a motor vehicle headlight, for example, for realizing a low-beam light function and a high-beam light function. By making contact with two adjacent connection contacts 2, it is advantageously also possible to make contact with individual LED chips 5 and, for example, to test them in this way.

At least two of the electrical connection contacts 2 are connected to a power supply via an electrical connection 9, for example bonding wires. Instead of bonding wires 9, strip contacts can also be used, said strip contacts advantageously being distinguished by a high current-carrying capacity.

The connection contacts 2 are advantageously not electrically conductively connected to the base surface 11 of the LED module 10, but rather are electrically insulated from the base surface 11 by the material of the electrically insulating main body 1. Since the heat sink 3 is also advantageously electrically insulated from the LED chips 5 by the electrically insulating carrier substrates 4, the base surface 11 of the LED module 10 is advantageously potential-free overall. Therefore, electrical contact is made with the LED module 10 advantageously exclusively from the side of the mounting surface 12.

An upper part 21 of the main body 1 advantageously forms a cavity 13 in which the LED chips 5 are arranged. The inner walls 14 of the cavity 13 advantageously serve for the beam shaping of the radiation emitted by the LED chips 5. By way of example, the inner walls 14 of the cavity 13 can serve as a reflector or as diaphragms for the radiation emitted by the LED chips 5.

The cavity 13 can be filled, for example, with a potting material, such as, a silicone, for example. This has the advantage, firstly, that the LED chips 5 and the bonding wires 8 led to the chip contacts 6, 7 are protected against external effects. Furthermore, the potting material can be filled with a phosphor in order to convert at least part of the radiation emitted by the LED chips 5 toward a longer wavelength. In this way, white light can be generated, for example, with LED chips 5 that emit in the blue spectral range.

A partial region of the upper part 21 of the main body 1 is advantageously arranged on the connection contacts 2 in such a way that it subdivides the connection contacts 2 into first regions 2a and second regions 2b. The first regions 2a of the connection contacts 2 face the LED chips 5 and are arranged within the cavity 13. Said regions 2a advantageously serve for the connection of the chip contacts 6, 7 of the LED chips 5 to the connection contacts 2 by means of bonding wires 8. The second regions 2b of the connection contacts 2 are arranged outside the cavity 13 and are therefore freely accessible externally. Said regions 2b are provided for externally making contact with the connection contacts 2, for example, for electrical connection to the conductor track of a printed circuit board by means of a bonding wire 9.

In the exemplary embodiment illustrated in a cross section in FIG. 2, the LED module 10 has been mounted onto a metal-core circuit board 15. The construction of the LED module 10 corresponds to the first exemplary embodiment and will therefore not be explained in greater detail again.

The metal-core circuit board 15 has a metal core 16 with an electrically insulating layer 17 applied thereto, wherein an electrically conductive layer 18 structured to form one or more conductor tracks is applied to the electrically insulating layer 17. The electrically insulating layer 17 is formed from FR4, for example. The electrically conductive layer 18 comprises, for example, copper, nickel, gold, an alloy comprising at least one of these materials, or a layer sequence composed of one or more of these materials. The metal core 16 is preferably formed from a metal or a metal alloy having good thermal conductivity, in particular from aluminum, copper or alloys comprising aluminum and/or copper.

In one preferred configuration, the electrically conductive layer 18 and the electrically insulating layer 17 are removed from the metal core 16 in the region in which the LED module 10 is mounted onto the metal-core circuit board 15. This advantageously makes it possible for the LED module 10 to be soldered or adhesively bonded directly onto the metal core 16 of the metal-core circuit board 15. The thermal resistance between the LED chips 5 and the metal core 16 is advantageously reduced in this way.

Particularly preferably, the LED module 10 is adhesively bonded onto the metal core 16 by means of a conductive adhesive 19 containing silver, in particular by means of a silver-containing epoxy conductive adhesive. In this way, the heat generated in the LED chips 5 can be dissipated to the metal core 16 particularly well via the carrier substrates 4, the heat sink 3 and the conductive adhesive 19. Preferably, the total thermal resistance between the LED chips 5 and the metal core 16 is only 1 K/W or less.

The heat sink 3 and the metal core 16 are preferably formed from the same metal or the same metal alloy. This has the advantage that mechanical stresses between the heat sink 3 and the metal core 16 that are caused by temperature changes are reduced. The long-term stability of the LED module 10 is improved in this way.

Figure 3A:
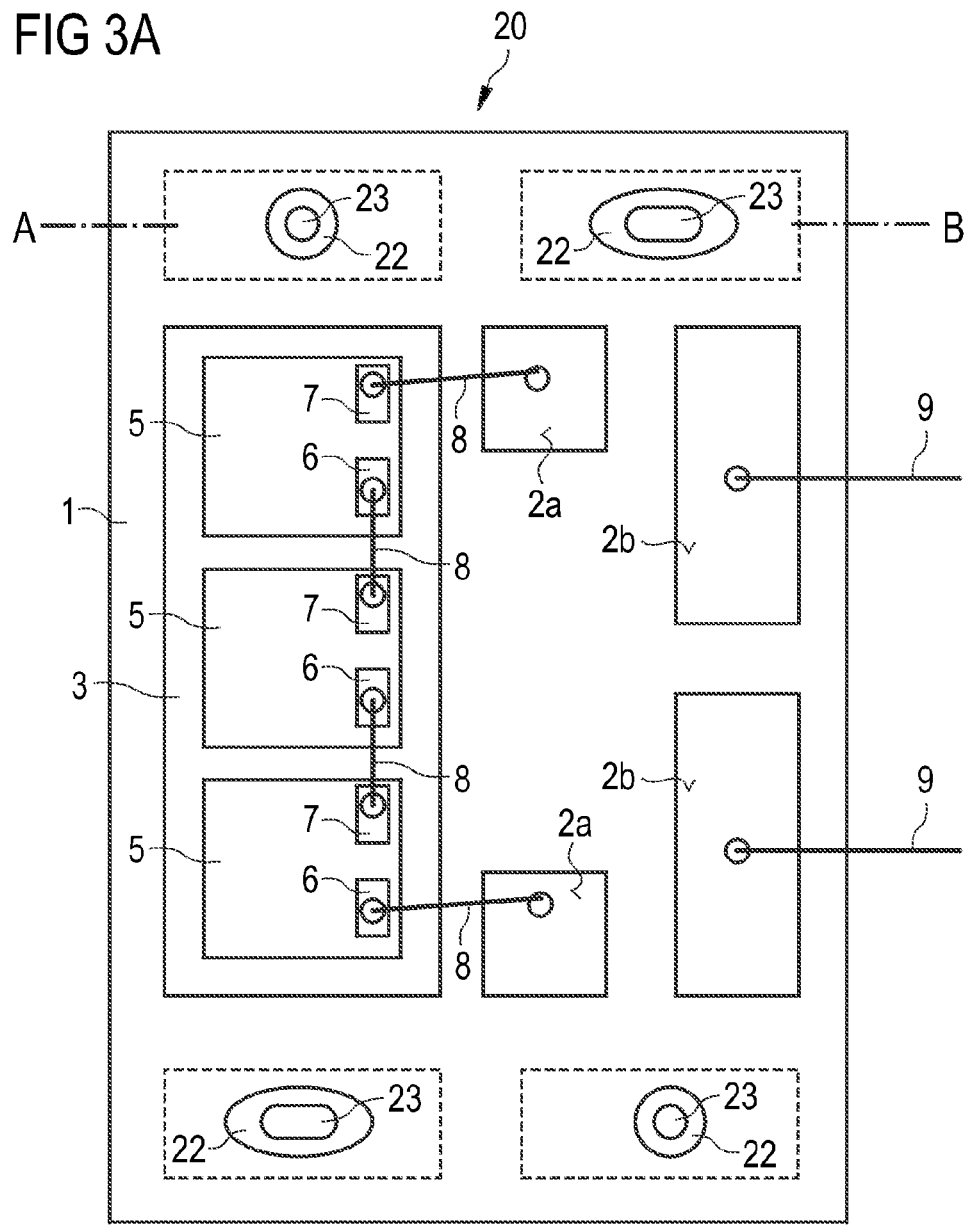
FIG. 3A shows a schematic illustration of a plan view of an LED module in accordance with a third exemplary embodiment.
Figure 3B:
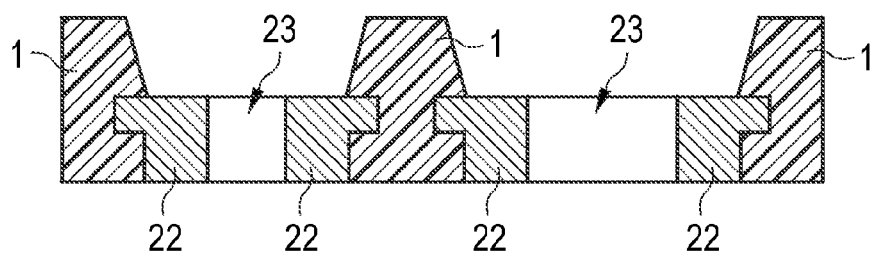
FIG. 3B shows a schematic illustration of a cross section along the line AB through the LED module in accordance with the third exemplary embodiment.

FIGS. 3A and 3B illustrate a further exemplary embodiment of an LED module 20 in a plan view and a cross section (not true to scale) along the line AB depicted in the plan view. The LED module 20 differs from the two previous exemplary embodiments firstly in that a series circuit of the LED chips 5 is realized by the first LED chip 5 and the last LED chip 5 of the series circuit being connected in each case to one of the connection contacts 2, wherein the connections between the adjacent LED chips 5 is however not effected via a common connection contact, but rather by connections by means of bonding wires 8 between the adjacent LED chips. In other words, provision is made of only in each case one connection contact 2 for the first LED chip 5 of the series circuit and the last LED chip 5 of the series circuit. Contact can be made in this way particularly if provision is not made for making contact separately with one or more of the LED chips 5 of the series circuit.

In the exemplary embodiment in FIGS. 3A and 3B, alignment structures 22 are formed in the edge regions of the main body 1. The alignment structures 22 are, for example, structures composed of a metal which are embedded in the main body 1 and which have cutouts 23. Alignment or fixing means can engage into the cutouts 23 of the alignment structures 22 from outside. The mounting of the LED module 20 at a predetermined position, for example, in a motor vehicle headlight, is facilitated in this way. The LED module 20 can be, in particular, part of a motor vehicle headlight.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An LED module comprising:
   an electrically insulating main body having a base surface and a mounting surface located opposite the base surface;
   a plurality of electrical connection contacts arranged at the mounting surface, wherein the connection contacts do not adjoin the base surface;
   a heat sink arranged in the main body, the heat sink extending from the mounting surface as far as the base surface; and
   a plurality of LED chips, each LED chip having an electrically insulating carrier substrate at a chip underside and two chip contacts at a chip top side, wherein the LED chips are each arranged with the electrically insulating carrier substrate on the heat sink,
   wherein the LED module is mounted onto a metal-core circuit board at the base surface, the metal-core circuit board comprising a metal core and conductor tracks disposed thereon, the conductor tracks being isolated from metal core by an insulating layer, and wherein the heat sink is connected to the metal core of the metal-core circuit board.

2. The LED module according to claim 1, wherein the electrically insulating carrier substrates of the LED chips comprise AlN or SiN.

3. The LED module according to claim 1, wherein the LED chips have no growth substrate.

4. The LED module according to claim 1, wherein the base surface of the LED module has no electrical connection contacts.

5. The LED module according to claim 1, wherein the heat sink and the metal core are formed from the same metal.

6. The LED module according to claim 1, wherein the heat sink and the metal core are formed from the same metal alloy.

7. The LED module according to claim 1, wherein the heat sink is connected to the metal core of the metal-core circuit board by a conductive adhesive containing silver.

8. The LED module according to claim 1, wherein an upper part of the electrically insulating main body forms a cavity in which the LED chips are arranged, the upper part being arranged above the mounting surface.

9. The LED module according to claim 8, wherein a partial region of the upper part is arranged on the connection contacts in such a way that a first region of the connection contacts facing the LED chips is arranged in the cavity, and a second region of the connection contacts is arranged outside the cavity.

10. The LED module according to claim 8, further comprises a potting material arranged in the cavity.

11. The LED module according to claim 1, wherein the chip contacts of the LED chips are each electrically conductively connected to one of the electrical connection contacts.

12. The LED module according to claim 11, wherein the chip contacts of each LED chip are connected to two adjacent connection contacts in such a way that the LED chips are arranged in a series circuit.

13. The LED module according to claim 1, wherein the main body has at least one alignment structure.

14. The LED module according to claim 1, wherein the LED module is part of a motor vehicle headlight.

15. The LED module according to claim 1, wherein the heat sink comprises aluminum and/or copper, wherein the metal core comprises aluminum and/or copper, and wherein the LED module is adhesively bonded onto the metal core by a conductive adhesive containing silver.

16. The LED module dependent claim 15, wherein the conductive adhesive is a silver-containing epoxy adhesive.

17. An LED module comprising:
   an electrically insulating main body having a base surface and a mounting surface located opposite the base surface;
   a plurality of electrical connection contacts arranged at the mounting surface, wherein the connection contacts do not adjoin the base surface;
   a heat sink arranged in the main body, the heat sink extending from the mounting surface as far as the base surface; and
   a plurality of LED chips, each LED chip having an electrically insulating carrier substrate at a chip underside and two chip contacts at a chip top side,
   wherein the LED chips are each arranged with the electrically insulating carrier substrate on the heat sink,
   wherein the electrically insulating carrier substrates of the LED chips comprise AlN or SiN,
   wherein the LED chips have no growth substrate,
   wherein the LED module is mounted onto a metal-core circuit board at the base surface, the metal-core circuit board comprising a metal core, an electrically insulating layer disposed thereon, and electrically conductive conductor tracks disposed on the electrically insulating layer, and
   wherein the heat sink is connected to the metal core of the metal-core circuit board.

18. The LED module according to claim 17, wherein the heat sink comprises aluminum and/or copper, wherein the metal core comprises aluminum and/or copper, and wherein the LED module is adhesively bonded onto the metal core by a conductive adhesive containing silver.

19. The LED module dependent claim 18, wherein the conductive adhesive is a silver-containing epoxy adhesive.

* * * * *

UNITED STATES PATENT AND TRADEMARK OFFICE
CERTIFICATE OF CORRECTION

| | | |
|---|---|---|
| PATENT NO. | : 9,190,394 B2 | Page 1 of 1 |
| APPLICATION NO. | : 14/346687 | |
| DATED | : November 17, 2015 | |
| INVENTOR(S) | : Frank Singer | |

It is certified that error appears in the above-identified patent and that said Letters Patent is hereby corrected as shown below:

In the claims

In Col. 10, line 17, claim 16, delete "The LED module dependent claim 15," and insert --The LED module according to claim 15,--.

In Col. 10, line 51, claim 19, delete "The LED module dependent claim 18," and insert --The LED module according to claim 18,--.

Signed and Sealed this
Seventh Day of June, 2016

Michelle K. Lee
*Director of the United States Patent and Trademark Office*